United States Patent
Lin et al.

(10) Patent No.: US 12,127,414 B2
(45) Date of Patent: Oct. 22, 2024

(54) SEMICONDUCTOR DEVICE AND METHOD FOR FABRICATING THE SAME

(71) Applicant: UNITED MICROELECTRONICS CORP., Hsin-Chu (TW)

(72) Inventors: Da-Jun Lin, Kaohsiung (TW); Yi-An Shih, Changhua County (TW); Bin-Siang Tsai, Changhua County (TW); Fu-Yu Tsai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/209,469

(22) Filed: Jun. 13, 2023

(65) Prior Publication Data

US 2023/0329003 A1 Oct. 12, 2023

Related U.S. Application Data

(62) Division of application No. 17/106,214, filed on Nov. 30, 2020, now Pat. No. 11,723,215.

(30) Foreign Application Priority Data

Nov. 2, 2020 (CN) .......................... 202011203268.7

(51) Int. Cl.
*H10B 61/00* (2023.01)
*H10N 50/01* (2023.01)
*H10N 50/80* (2023.01)

(52) U.S. Cl.
CPC ............. *H10B 61/00* (2023.02); *H10N 50/01* (2023.02); *H10N 50/80* (2023.02)

(58) Field of Classification Search
CPC ........ H10B 61/00; H10B 61/22; H10N 50/01; H10N 50/80; H10N 50/10; H01L 21/76838
See application file for complete search history.

(56) References Cited

U.S. PATENT DOCUMENTS

| | | | |
|---|---|---|---|
| 8,865,481 B2 | 10/2014 | Li et al. | |
| 2010/0054028 A1 | 3/2010 | Xia | |
| 2011/0089507 A1* | 4/2011 | Mao | H10B 61/00 257/E29.323 |
| 2018/0097175 A1* | 4/2018 | Chuang | H10B 61/00 |
| 2018/0166501 A1 | 6/2018 | Chuang | |
| 2018/0358555 A1* | 12/2018 | Lee | H10B 43/27 |
| 2020/0035908 A1 | 1/2020 | Ku | |
| 2020/0158582 A1 | 5/2020 | Kothandaraman | |
| 2021/0091139 A1* | 3/2021 | Tseng | H10N 50/01 |
| 2021/0376228 A1 | 12/2021 | Peng | |

* cited by examiner

*Primary Examiner* — Shih Tsun A Chou
(74) *Attorney, Agent, or Firm* — Winston Hsu

(57) ABSTRACT

A method for fabricating a semiconductor device includes the steps of first forming a magnetic tunneling junction (MTJ) on a substrate, forming a top electrode on the MTJ, forming an inter-metal dielectric (IMD) layer around the top electrode and the MTJ, forming a landing layer on the IMD layer and the MTJ, and then patterning the landing layer to form a landing pad. Preferably, the landing pad is disposed on the top electrode and the IMD layer adjacent to one side of the top electrode.

9 Claims, 5 Drawing Sheets

SEMICONDUCTOR DEVICE AND METHOD FOR FABRICATING THE SAME

CROSS REFERENCE TO RELATED APPLICATIONS

This application is a division of U.S. application Ser. No. 17/106,214, filed on Nov. 30, 2020. The content of the application is incorporated herein by reference.

BACKGROUND OF THE INVENTION

1. Field of the Invention

The invention relates to a semiconductor device, and more particularly to a magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes the steps of first forming a magnetic tunneling junction (MTJ) on a substrate, forming a top electrode on the MTJ, forming an inter-metal dielectric (IMD) layer around the top electrode and the MTJ, forming a landing layer on the IMD layer and the MTJ, and then patterning the landing layer to form a landing pad. Preferably, the landing pad is disposed on the top electrode and the IMD layer adjacent to one side of the top electrode.

According to another aspect of the present invention, a semiconductor device includes a magnetic tunneling junction (MTJ) on a substrate, a top electrode on the MTJ, a first inter-metal dielectric (IMD) layer around the top electrode and the MTJ, and a landing pad on the top electrode and the first IMD layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
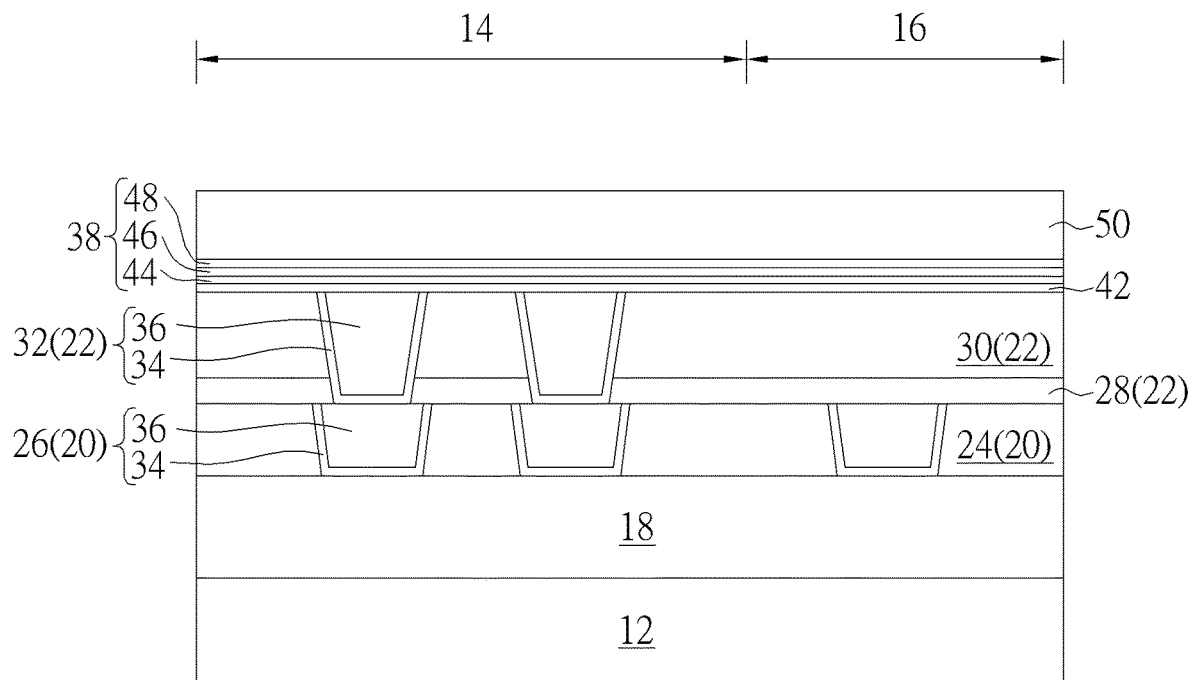
FIGS. 1-9 illustrate a method for fabricating a MRAM device according to an embodiment of the present invention.

Referring to FIGS. 1-9, FIGS. 1-9 illustrate a method for fabricating a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region 16 are defined on the substrate 12.

Active devices such as metal-oxide semiconductor (MOS) transistors, passive devices, conductive layers, and interlayer dielectric (ILD) layer 18 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 18 could be formed on the substrate 12 to cover the MOS transistors, and a plurality of contact plugs could be formed in the ILD layer 18 to electrically connect to the gate structure and/or source/drain region of MOS transistors. Since the fabrication of planar or non-planar transistors and ILD layer is well known to those skilled in the art, the details of which are not explained herein for the sake of brevity.

Next, metal interconnect structures 20, 22 are sequentially formed on the ILD layer 18 on the MRAM region 14 and the logic region 16 to electrically connect the aforementioned contact plugs, in which the metal interconnect structure 20 includes an inter-metal dielectric (IMD) layer 24 and metal interconnections 26 embedded in the IMD layer 24, and the metal interconnect structure 22 includes a stop layer 28, an IMD layer 30, and metal interconnections 32 embedded in the stop layer 28 and the IMD layer 30.

In this embodiment, each of the metal interconnections 26 from the metal interconnect structure 20 preferably includes a trench conductor and the metal interconnection 32 from the metal interconnect structure 22 on the MRAM region 14 includes a via conductor. Preferably, each of the metal interconnections 26, 32 from the metal interconnect structures 20, 22 could be embedded within the IMD layers 24, 30 and/or stop layer 28 according to a single damascene process or dual damascene process. For instance, each of the metal interconnections 26, 32 could further includes a barrier layer 34 and a metal layer 36, in which the barrier layer 34 could be selected from the group consisting of titanium (Ti), titanium nitride (TiN), tantalum (Ta), and tantalum nitride (TaN) and the metal layer 36 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 36 are preferably made of copper, the IMD layers 24, 30 are preferably made of silicon oxide, and the stop layers 28 is preferably made of nitrogen doped carbide (NDC), silicon nitride, silicon carbon nitride (SiCN), or combination thereof.

Next, a bottom electrode 42, a MTJ stack 38 or stack structure, a top electrode 50, and a patterned mask (not shown) are formed on the metal interconnect structure 22. In this embodiment, the formation of the MTJ stack 38 could be accomplished by sequentially depositing a pinned layer 44, a barrier layer 46, and a free layer 48 on the bottom electrode 42. In this embodiment, the bottom electrode layer 42 and the top electrode layer 50 are preferably made of conductive material including but not limited to for example Ta, Pt, Cu, Au, Al, or combination thereof. The pinned layer 44 could be made of ferromagnetic material including but not limited to for example iron, cobalt, nickel, or alloys thereof such as cobalt-iron-boron (CoFeB) or cobalt-iron (CoFe). Moreover, the pinned layer 44 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 44 is formed to fix or limit the direction of magnetic moment of adjacent layers. The barrier layer 46 could be made of insulating material including but not limited to for example oxides such as aluminum oxide (AlOx) or magnesium oxide (MgO). The free layer 48 could be made of ferromagnetic material including but not limited to for example iron, cobalt, nickel, or alloys thereof such as cobalt-iron-boron (CoFeB), in which the magnetized direction of the free layer 48 could be altered freely depending on the influence of outside magnetic field.

Figure 2:
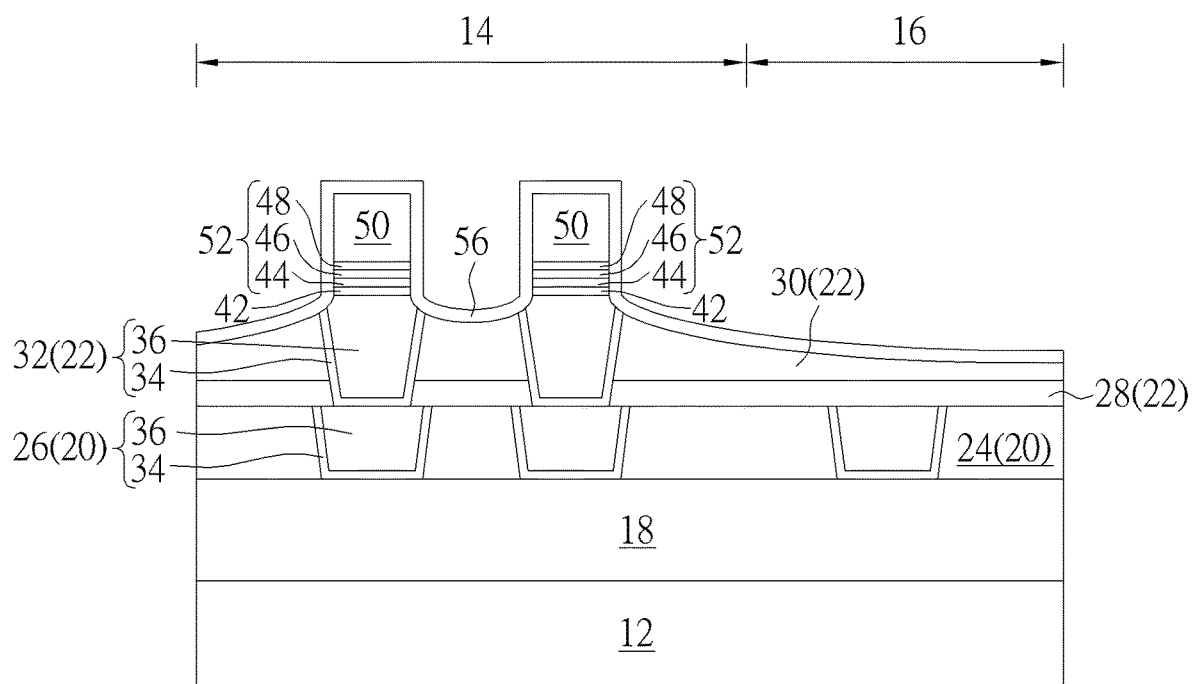

Next, as shown in FIG. 2, one or more etching process is conducted by using the patterned mask as mask to remove part of the top electrode 50, part of the MTJ stack 38, part of the bottom electrode 42, and part of the IMD layer 30 to form MTJs 52 on the MRAM region 14. It should be noted that a reactive ion etching (RIE) and/or an ion beam etching (IBE) process is conducted to remove the top electrode 50, MTJ stack 38, bottom electrode 42, and the IMD layer 38 in this embodiment for forming the MTJs 52. Due to the characteristics of the IBE process, the top surface of the remaining IMD layer 30 is slightly lower than the top surface of the metal interconnections 32 after the IBE process and the top surface of the IMD layer 30 also reveals a curve or an arc. It should also be noted that as the IBE process is conducted to remove part of the IMD layer 30, part of the metal interconnection 32 is removed at the same time to form inclined sidewalls on the surface of the metal interconnection 32 immediately adjacent to the MTJs 52.

Next, a cap layer 56 is formed on the MTJs 52, while covering the surface of the IMD layer 30. In this embodiment, the cap layer 56 preferably includes silicon nitride, but could also include other dielectric material including but not limited to for example silicon oxide, silicon oxynitride (SiON), or silicon carbon nitride (SiCN).

Figure 3:
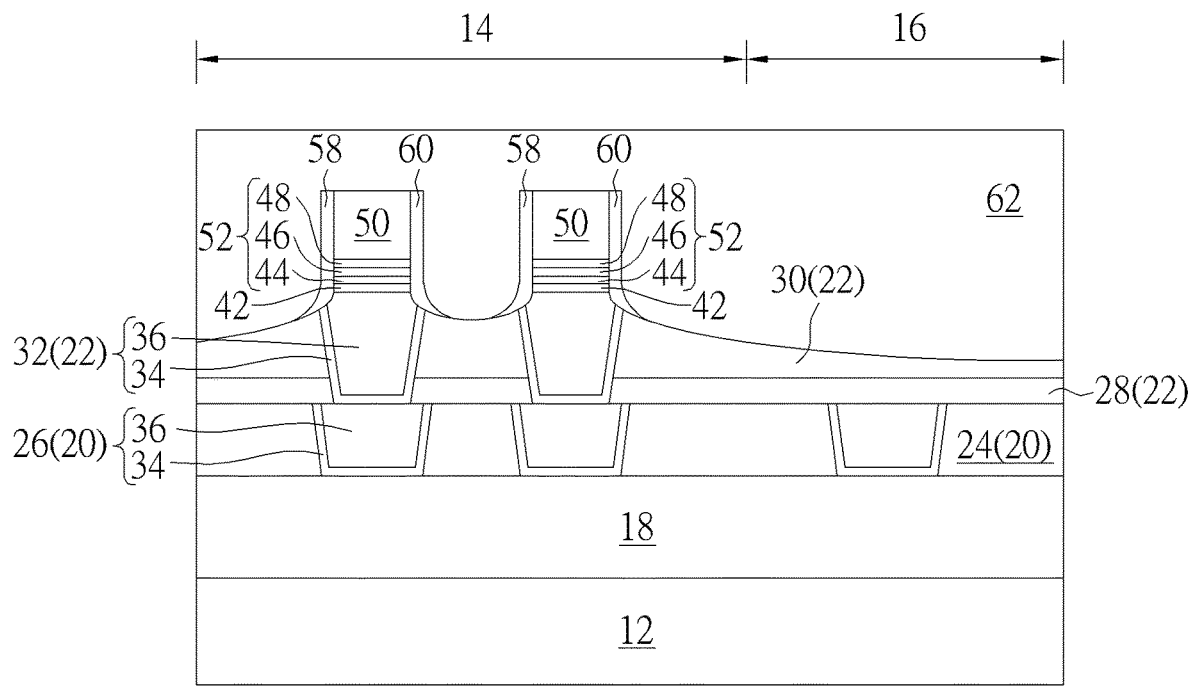

Next, as shown in FIG. 3, an etching back process is conducted to remove part of the cap layer 56 for forming spacers 58, 60 on sidewalls of each of the MTJs 52, and an atomic layer deposition (ALD) process is conducted to form an inter-metal dielectric (IMD) layer 62 on the MTJs 52 and the IMD layer 30 on the logic region 16. In this embodiment, the 1 MB layer 62 preferably include an ultra low-k (ULK) dielectric layer including but not limited to for example porous material or silicon oxycarbide (SiOC) or carbon doped silicon oxide (SiOCH).

Figure 4:
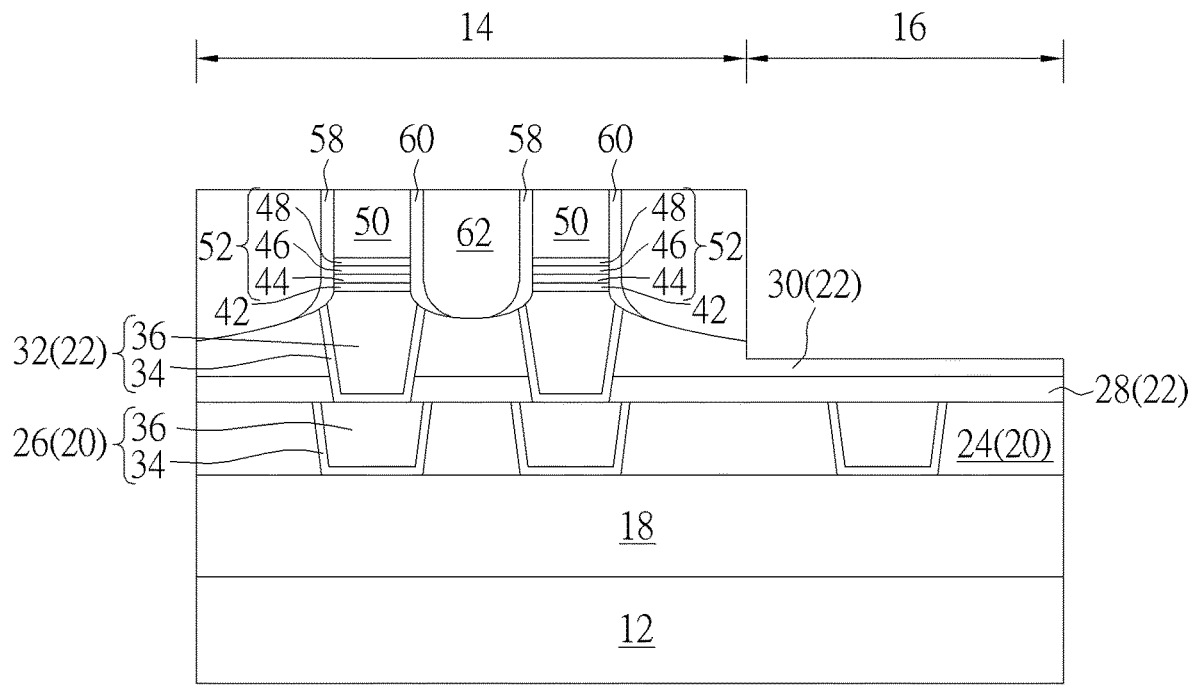

Next, as shown in FIG. 4, one or more etching process is conducted to remove part of the IMD layer 62 on the MRAM region 14 and logic region 16. For instance, it would be desirable to first remove part of the IMD layer 62 on both MRAM region 14 and logic region 16 so that the top surfaces of the 1 MB layer 62 and the top electrodes 50 are coplanar, form a patterned mask (not shown) on the MRAM region 14, and then remove all of the remaining IMD layer 62 on the logic region 16 and exposing the IMD layer 30 underneath so that the remaining IMD layer 62 is only disposed around the MTJs 52 on the MRAM region 14.

Figure 5:
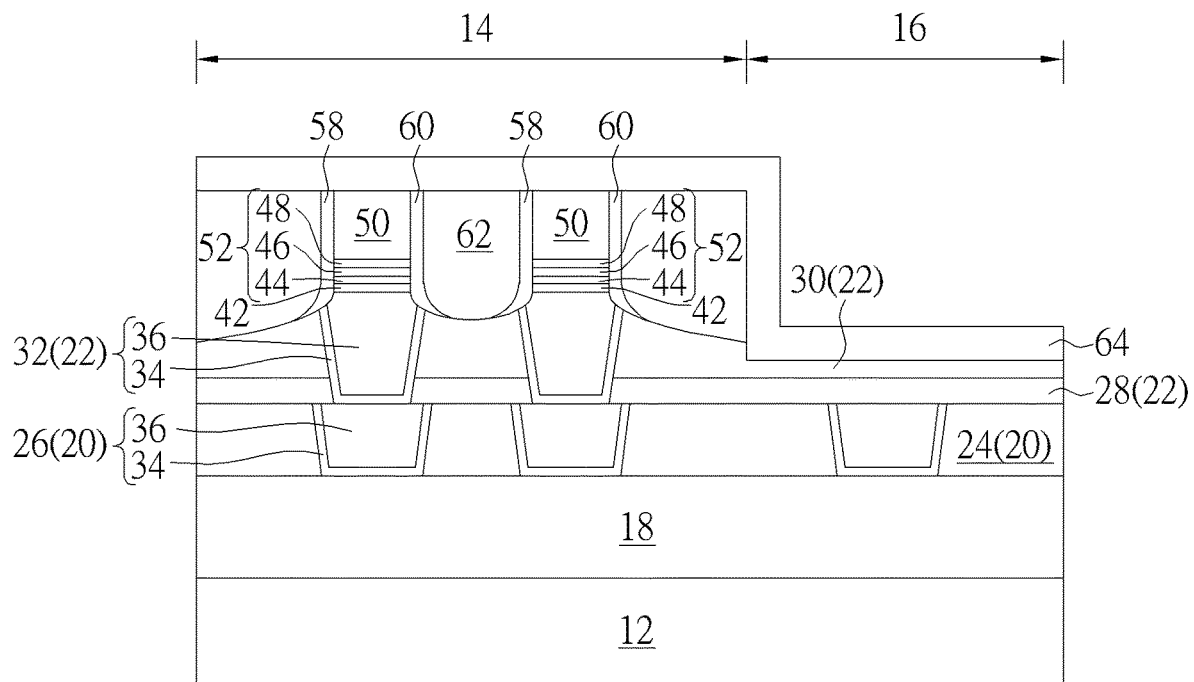

Next, as shown in FIG. 5, a landing layer 64 is formed on the MRAM region 14 and the logic region 16, in which the landing layer 64 preferably covers and directly contacts the top surface of the top electrodes 50 and top surface and sidewalls of the IMD layer 62 on the MRAM region 14 and top surface of the 1 MB layer 30 on the logic region 16. In this embodiment, the landing layer 64 preferably includes conductive material including but not limited to for example titanium (Ti), tantalum (Ta), titanium nitride (TiN), and/or tantalum nitride (TaN).

Figure 6:
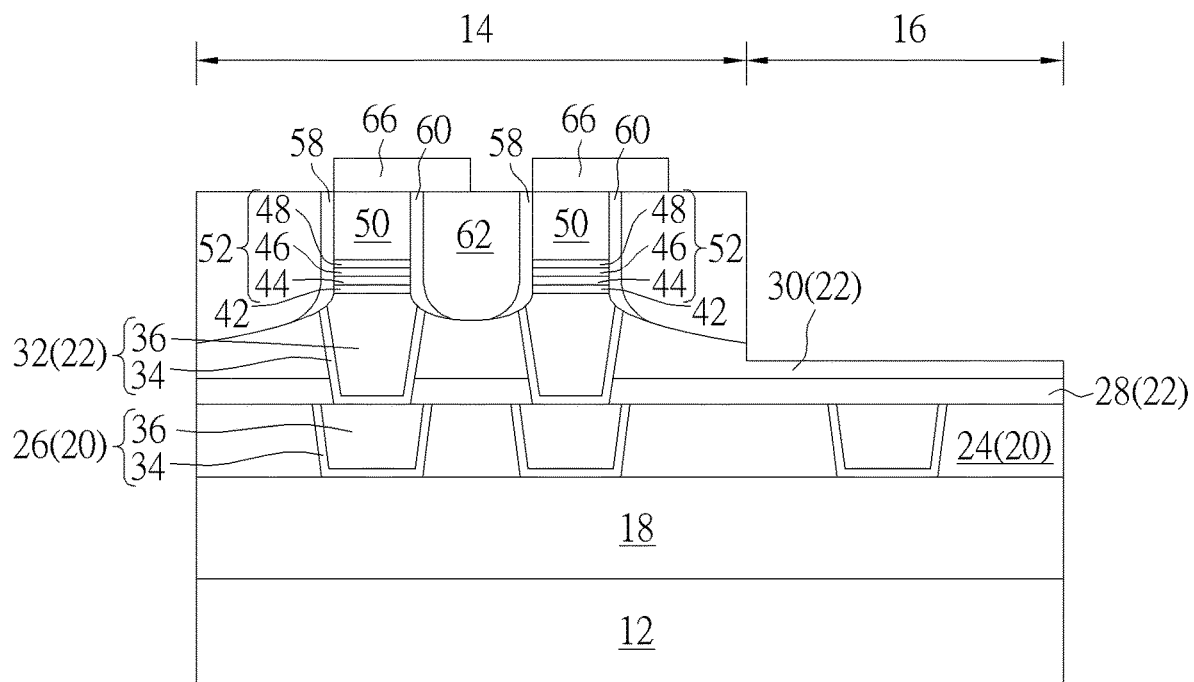

Next, as shown in FIG. 6, the landing layer 64 is patterned to form landing pads 66 directly on each of the MTJs 52 on the MRAM region 14. Specifically, a photo-etching process is conducted to remove part of the landing layer 64 on the MRAM region 14 and all of the landing layer 64 on the logic region 16 so that the remaining landing layer 64 forms a plurality of landing pads 66 on the MTJs 52, in which each of the landing pads 66 preferably covers the top surface of top electrodes 50 above the MTJs 52 and the spacer 60 and IMD layer 62 adjacent to one side of the top electrodes 50 but not covering the spacer 60 and IMD layer 62 adjacent to another side of the top electrodes 50.

Figure 7:
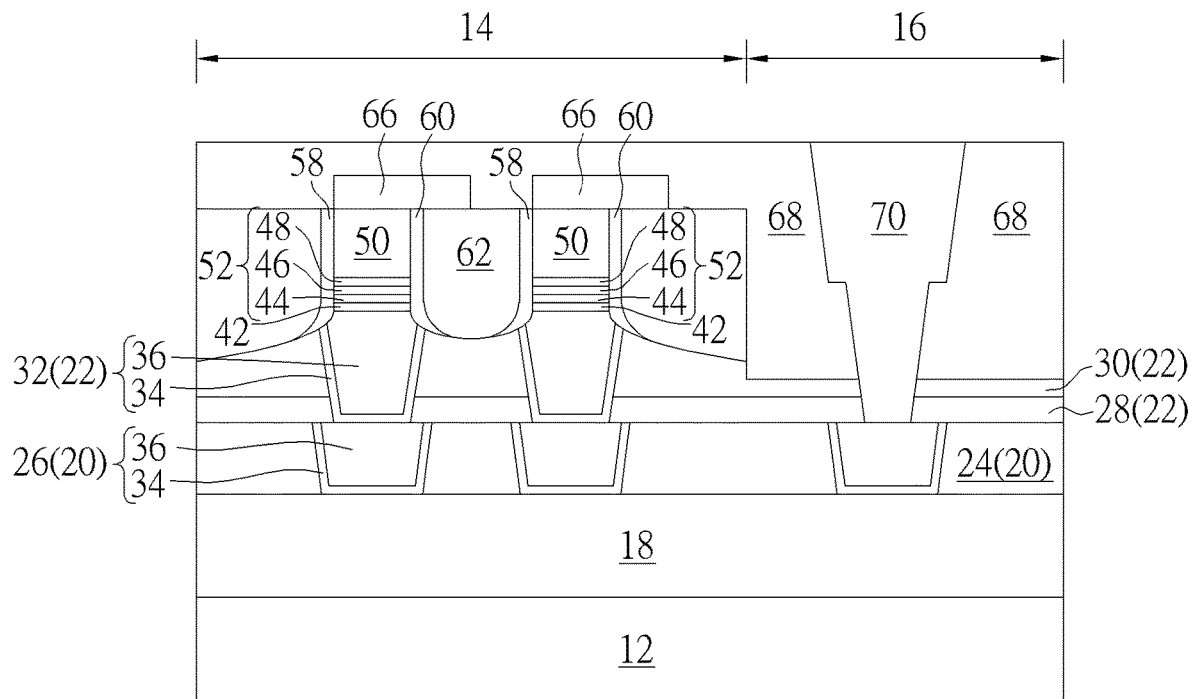

Next, as shown in FIG. 7, an IMD layer 68 is formed on the MRAM region 14 and logic region 16 to cover the landing pads 66 and IMD layer 62 on the MRAM region 14 and IMD layer 30 on the logic region 16. Next, a pattern transfer process is conducted by using a patterned mask (not shown) to remove part of the IMD layer 68, part of the IMD layer 30, and part of the stop layer 28 on the logic region 16 to form a contact hole (not shown) exposing the metal interconnection 26 underneath and conductive materials are deposited into the contact hole afterwards. For instance, a barrier layer selected from the group consisting of titanium (Ti), titanium nitride (TiN), tantalum (Ta), and tantalum nitride (TaN) and metal layer selected from the group consisting of tungsten (W), copper (Cu), aluminum (Al), titanium aluminide (TiAl), and cobalt tungsten phosphide (CoWP) could be deposited into the contact hole, and a planarizing process such as CMP could be conducted to remove part of the conductive materials including the aforementioned barrier layer and metal layer to form a metal interconnection 70 in the contact hole electrically connecting the metal interconnection 26. Preferably, the IMD layer 68 preferably include an ultra low-k (ULK) dielectric layer including but not limited to for example porous material or silicon oxycarbide (SiOC) or carbon doped silicon oxide (SiOCH).

Figure 8:
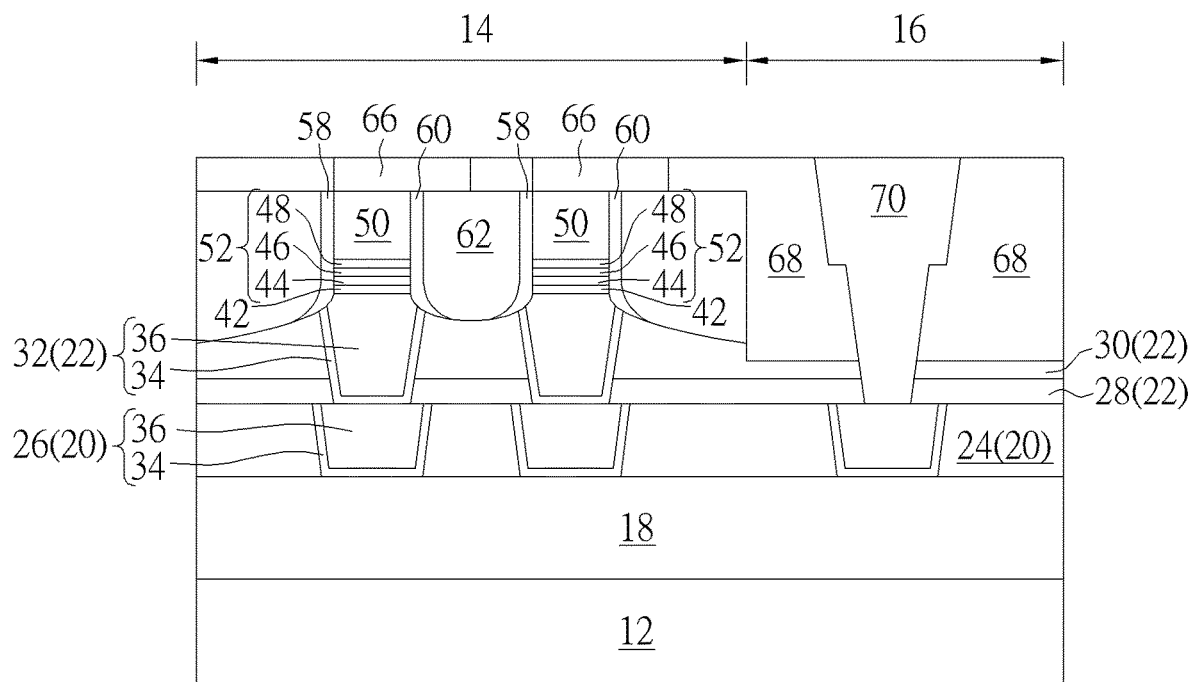

Next, as shown in FIG. 8, a planarizing process such as CMP process is conducted to remove part of the IMD layer 68 on the MRAM region 14 and part of the IMD layer 68 and part of the metal interconnection 70 on the logic region 16. This exposes the landing pads 66 on the MRAM region 14 so that the top surface of the metal interconnection 70 on the logic region is even with the top surfaces of the landing pads 66 and IMD layer 68 on the MRAM region 14.

Figure 9:
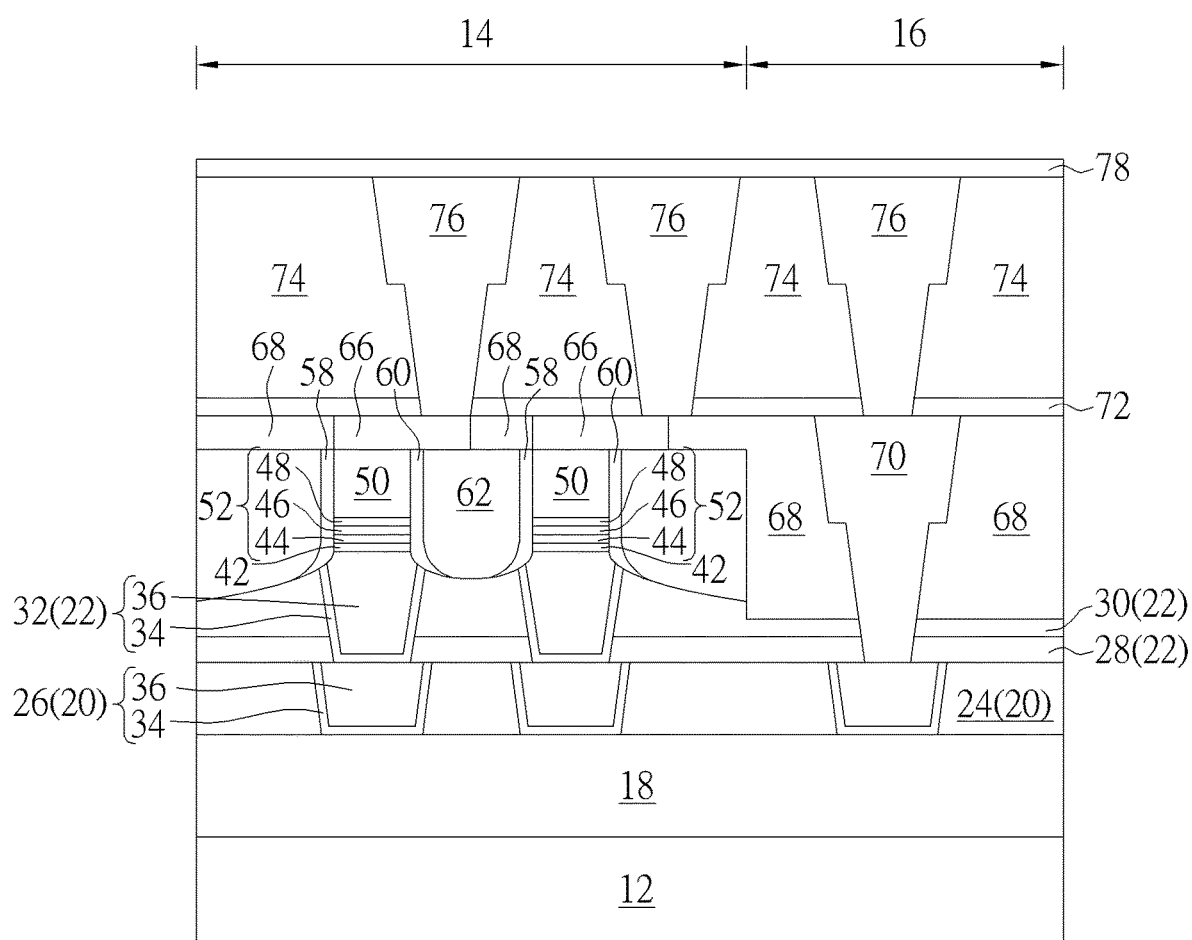

Next, as shown in FIG. 9, a stop layer 72 is formed on the MRAM region 14 and logic region 16 to cover the landing pads 66, 1 MB layer 68, and metal interconnection 70, an 1 MB layer 74 is formed on the stop layer 72, and one or more photo-etching process is conducted to remove part of the IMD layer 74 and part of the stop layer 72 on the MRAM region 14 and logic region 16 to form contact holes (not shown). Next, conductive materials are deposited into each of the contact holes and a planarizing process such as CMP is conducted to form metal interconnections 76 connecting the MTJs 52 and metal interconnection 70 underneath, in which the metal interconnections 76 on the MRAM region 14 directly contacts the landing pads 66 underneath while the metal interconnection 76 on the logic region 16 directly contacts the metal interconnection 70 on the lower level. Next, another stop layer 78 is formed on the 1 MB layer 74 to cover the metal interconnections 76.

In this embodiment, the stop layers 72 and 78 could be made of same or different materials, in which the two layers 72, 78 could all include nitrogen doped carbide (NDC), silicon nitride, silicon carbon nitride (SiCN), or combination thereof. Similar to the metal interconnections formed previously, each of the metal interconnections 76 could be formed in the IMD layer 74 through a single damascene or dual damascene process. For instance, each of the metal interconnections 76 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. This completes the fabrication of a semiconductor device according to an embodiment of the present invention.

Referring to FIG. 9, FIG. 9 further illustrates a structural view of a semiconductor device according to an embodiment of the present invention. As shown in FIG. 9, the semiconductor device includes at least a MTJ 52 disposed on the substrate 12 of the MRAM region 14, a top electrode 50 disposed on the MTJ 52, a spacer 58 adjacent to one side of the top electrode 50, a spacer 60 adjacent to another side of the top electrode 50, a landing pad 66 disposed on the top electrode 50 and the IMD layer 62 adjacent to the top electrode 50, an IMD layer 68 disposed on the MRAM region 14 and logic region 16 while surrounding the IMD layer 62 and the landing pad 66 on the MRAM region 14, a metal interconnection 70 disposed in the IMD layer 68 on the logic region 16, a stop layer 72 disposed on the landing pad 66 on the MRAM region 14 and the IMD layer 68 on the logic region 16, an IMD layer 74 disposed on the stop layer 72, and metal interconnections 76 disposed in the IMD layer 74 to electrically connect the landing pad 66 and the metal interconnection 70 respectively.

Viewing from a more detailed perspective, the top surface of the landing pads 66 on the MRAM region 14 is even with the top surface of the metal interconnection 70 on the logic region 16, a sidewall such as the left sidewall of each of the landing pads 66 is aligned with the sidewall of the top electrodes 50 while another sidewall such as the right sidewall of each of the landing pads 66 is extended on the IMD layer 62 and not aligned with the sidewall of the top electrodes 50. It should be noted that in conventional art, metal interconnection 76 electrically connecting the top electrode 50 is disposed directly on top and relative to the center of the MTJ 52 and/or top electrode 50. This design however often induces a lot of stress to the MTJ 52 underneath as the metal interconnection 76 is pressing downward. To resolve this issue the present invention preferably shifts the center or central point of the metal interconnection 76 away from the center of the MTJ 52 and/or top electrode 50 such that the bottom surface of the metal interconnection 76 would directly contact the part of landing pad 66 adjacent to one side of the top electrode 50 instead of the part of landing pad 66 directly on top of the top electrode 50 while both left and right sidewalls of the top electrode 50 are aligned with left and right sidewalls of the MTJ 52 underneath.

In other words, the bottom portion of the metal interconnection 76 directly contacting the landing pad 66 is directly above the IMD layer 62 adjacent to one side of the top electrode 50 as the bottom portion of the metal interconnection 76 may even overlap part or all of the spacer 60 adjacent to one side of the top electrode 50 but not overlapping any of the top electrode 50 and MTJ 52. Moreover, at least a sidewall of the metal interconnection 76 could also be aligned with or not aligned with a sidewall of the landing pad 66 underneath. If a sidewall of the metal interconnection 76 were formed not to align with the sidewall of the landing pad 66, the bottom surface of the metal interconnection 76 could directly contacting the landing pad 66 and top surface of the IMD layer 68, such as the middle metal interconnection 76 connected to the right side MTJ 52 as shown in FIG. 9. In this embodiment, the landing pad 66 and the top electrode 60 could include same material or different materials while the two elements could both include conductive material including but not limited to for example titanium (Ti), tantalum (Ta), titanium nitride (TiN), and/or tantalum nitride (TaN).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
    forming a magnetic tunneling junction (MTJ) on a substrate;
    forming a top electrode on the MTJ;
    forming a first inter-metal dielectric (IMD) layer around the top electrode and the MTJ;
    forming a landing layer on the first IMD layer and a sidewall of the first IMD layer; and
    patterning the landing layer to form a landing pad on the top electrode and the first IMD layer.

2. The method of claim 1, wherein the substrate comprises a MRAM region and a logic region, the method further comprising:
    forming a second IMD layer on the MRAM region and the logic region;
    forming a first metal interconnection in the second IMD layer on the MRAM region;
    forming the MTJ on the first metal interconnection;
    forming the first IMD layer on the MRAM region and the logic region;
    removing the first IMD layer on the logic region;
    forming the landing layer on the MRAM region and the logic region;

patterning the landing layer to form the landing pad on the MRAM region;

forming a third IMD layer on the first IMD layer on the MRAM region and the second IMD layer on the logic region; and forming a second metal interconnection on the logic region.

3. The method of claim 2, further comprising:

forming a cap layer on the top electrode and the second IMD layer;

removing the cap layer to form a spacer around the MTJ; and forming the first IMD layer on the spacer.

4. The method of claim 2, further comprising:

forming the landing layer on the top electrode, a sidewall of the first IMD layer, and a top surface of the second IMD layer; and patterning the landing layer to form the landing pad on the top electrode and the first IMD layer.

5. The method of claim 2, wherein top surfaces of the landing pad and the second metal interconnection are coplanar.

6. The method of claim 2, further comprising:

forming a stop layer on the landing pad and the second metal interconnection;

forming a fourth IMD layer on the stop layer; and forming a third metal interconnection on the MRAM region to connect to the landing pad and a fourth metal interconnection on the logic region to connect to the second metal interconnection.

7. The method of claim 1, wherein a sidewall of the landing pad is aligned with a sidewall of the top electrode.

8. The method of claim 1, wherein the landing pad and the top electrode comprise a same material.

9. The method of claim 1, wherein the landing pad and the top electrode comprise different materials.

* * * * *